(12) United States Patent
Shibata

(10) Patent No.: US 7,045,808 B2
(45) Date of Patent: May 16, 2006

(54) III-V NITRIDE SEMICONDUCTOR SUBSTRATE AND ITS PRODUCTION LOT, AND III-V NITRIDE SEMICONDUCTOR DEVICE AND ITS PRODUCTION METHOD

(75) Inventor: Masatomo Shibata, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 3 days.

(21) Appl. No.: 10/799,889

(22) Filed: Mar. 15, 2004

(65) Prior Publication Data

US 2005/0139960 A1    Jun. 30, 2005

(30) Foreign Application Priority Data

Dec. 26, 2003    (JP)    ............... 2003-435071

(51) Int. Cl.
*H01L 29/06*    (2006.01)
(52) U.S. Cl. ............... 257/13; 257/79; 257/94
(58) Field of Classification Search ............... 257/13, 257/79, 94
See application file for complete search history.

(56) References Cited

U.S. PATENT DOCUMENTS

| | | | |
|---|---|---|---|
| 6,736,894 B1 * | 5/2004 | Kawahara et al. | 117/2 |
| 2003/0038302 A1 | 2/2003 | Yanashima et al. | |
| 2003/0183160 A1 * | 10/2003 | Fujikura et al. | 117/86 |

FOREIGN PATENT DOCUMENTS

| | | |
|---|---|---|
| JP | 2000-252217 | 9/2000 |
| JP | 2003-59835 A1 | 2/2003 |

* cited by examiner

*Primary Examiner*—Long Pham
(74) *Attorney, Agent, or Firm*—Sughrue Mion, PLLC

(57) ABSTRACT

A III–V nitride semiconductor substrate comprising a III–V nitride semiconductor single crystal at least in a surface portion thereof, the product of [H] and [D] being $1 \times 10^{25}$ or less, wherein [H] represents the concentration of hydrogen atoms (the number of hydrogen atoms per $cm^3$) in a surface portion of the single crystal, and [D] represents a dislocation density (the number of dislocations per $cm^2$) on a single crystal surface.

8 Claims, 2 Drawing Sheets

Concentration of Hydrogen Atoms (Number of Hydrogen Atoms/$cm^3$)

Numbers in the graph indicate Substrate Numbers

Numbers in the graph indicate Substrate Numbers

III-V NITRIDE SEMICONDUCTOR SUBSTRATE AND ITS PRODUCTION LOT, AND III-V NITRIDE SEMICONDUCTOR DEVICE AND ITS PRODUCTION METHOD

FIELD OF THE INVENTION

The present invention relates to a III–V nitride semiconductor substrate free from surface roughness due to thermal cleaning and a production lot of such substrates, and a III–V nitride semiconductor device such as LD, LED, etc. comprising such a III–V nitride semiconductor substrate and its production method.

BACKGROUND OF THE INVENTION

Because nitride semiconductor materials such as gallium nitride (GaN), indium gallium nitride (InGaN), gallium aluminum nitride (GaAlN), etc. have sufficiently wide forbidden bands with direct interband transition, their applications to short-wavelength light-emitting devices have been investigated. In addition, because of a large saturated drift velocity of electrons and the usability of a two-dimensional carrier gas in heterojunctions, their applications to electronic devices are expected.

Base substrates for the growth of GaN widely used at present are made of sapphire, and devices are generally produced by the following method. Namely, GaN is heteroepitaxially grown on a single-crystal sapphire base substrate by vapor phase growth methods such as a metalorganic vapor phase epitaxy (MOVPE) method, a molecular beam epitaxy (MBE) method, a hydride vapor phase epitaxy (HVPE) method, etc., and an epitaxial layer of a nitride semiconductor is grown thereon continuously in the same chamber or after transferred to a different chamber.

Because a sapphire base substrate and GaN are different in lattice constant, the growth of GaN directly on the sapphire base substrate fails to provide a single-crystal layer. Thus, JP 4-297023 A proposes the application of a low-temperature buffer layer technology developed for the purpose of the heterogrowth of Si, etc. on a sapphire base substrate to the growth of GaN, providing a method of growing GaN on a sapphire base substrate at as low a temperature as about 500° C., such that the resultant low-temperature-grown buffer layer relaxes lattice strain, and growing GaN thereon. The use of a low-temperature-grown nitride layer as a low-temperature buffer layer enables the epitaxial growth of single-crystal GaN on the sapphire base substrate. However, because there is a narrow optimum range between temperature and thickness in the growth of the low-temperature buffer layer, it is difficult to form a low-temperature buffer layer with good reproducibility.

Thus, instead of continuously conducting the epitaxial growth of a multilayer semiconductor film having a device structure on a sapphire base substrate, there is a method of growing a GaN layer on a base substrate in advance, and growing an epitaxial layer on the resultant substrate to form a device.

With a so-called GaN template provided by growing a GaN layer on the sapphire base substrate, however, even the low-temperature buffer layer technology cannot remove the discrepancy of a lattice between a substrate and a crystal, resulting in a GaN layer having a dislocation density of about $10^9$ to $10^{10}/cm^2$. Because this defect obstructs the production of GaN devices, particularly laser diodes (LDs) and ultraviolet light-emitting diodes (LEDs), GaN templates are predominantly used for visible-ray light-emitting diodes (LEDs) and electronic devices having characteristics little affected by dislocation.

In the case of LDs and ultraviolet LEDs needing epitaxial layers having low dislocation densities, a method of using a substrate constituted only by a GaN layer as a substrate for crystal growth, and forming a multilayer semiconductor film for constituting device elements on the substrate has been considered. Such a substrate constituted only by GaN for crystal growth is called "self-supported GaN substrate." Though the crystal growth of nitride semiconductors in a bulk form has been difficult, the development of self-supported GaN substrates on a practically usable level has recently been succeeded at last.

The self-supported GaN substrate is generally obtained by epitaxial growth of a thick GaN layer having a low dislocation density on a different base substrate such as a sapphire base substrate, and then separating the GaN layer from the base substrate. For instance, JP 10-256662 A discloses a method for growing a thick GaN layer on a sapphire base substrate, and then separating the GaN layer from the sapphire base substrate. JP 11-251253 A discloses a method for producing a self-supported GaN substrate comprising forming a GaN layer on sapphire base substrate, using a dislocation-reducing technology called "epitaxial lateral overgrowth (ELO)" described in Appl. Phys. Lett., Vol. 71 No. 18 (1997) p 2638, and etching the sapphire base substrate for removal. JP 2003-178984 A discloses a method comprising growing a GaN layer having a low dislocation density on a base substrate of sapphire, etc. via a thin TiN film having a network structure, using a void-assisted separation (VAS) method described in Y. Oshima, et al., Jpn. J. Appl. Phys., Vol. 42 (2003) pp. L1 to L3, and easily separating the GaN layer from the base substrate by voids in their interface. In an as-grown state, the GaN substrate obtained by these methods usually has morphology such as pits, hillocks, etc. on its surface, resulting in difficulty in growing an epitaxial layer for producing devices without further treatment. Therefore, the top surface of the substrate is generally mirror-polished before devices are produced thereon.

An MOVPE method is often used to epitaxially grow a group III nitride semiconductor having a device structure. When a group III nitride semiconductor is epitaxially grown on a sapphire base substrate by the MOVPE method, a so-called thermal cleaning, by which the sapphire base substrate is heated at 1000° C. or higher for a certain period of time in a hydrogen gas atmosphere, is generally carried out to remove stain from the sapphire base substrate surface.

When a group III nitride semiconductor single crystal is epitaxially grown on a GaN substrate (GaN template or self-supported GaN substrate) by the MOVPE method, too, the thermal cleaning is carried out to remove stain from the GaN substrate surface, or to remove residual strain added at the time of mirror finishing. For instance, JP 2000-252217 A discloses a method for removing defects from a ground surface of a single-crystal GaN substrate by heating the GaN substrate in an atmosphere containing hydrogen and ammonia before epitaxial growth. Also, JP 2003-59835 A discloses a method for carrying out the thermal cleaning of a GaN template or a self-supported GaN substrate at a temperature of 1200° C. or lower.

When the GaN template or the self-supported GaN substrate is subjected to thermal cleaning, it is desirable to remove only stain or a strain layer from a substrate surface, such that the GaN crystal surface is not damaged. However, surface roughening, a phenomenon that a GaN crystal on the substrate surface is thermally decomposed or sublimed, so that the flatness of the substrate surface is deteriorated, may likely occur on the substrate during the thermal cleaning. In the case of thermal decomposition, metallic Ga droplets may be formed on the substrate surface. Thermally decomposed or sublimed GaN may be regrown on the substrate at different points, deteriorating single crystallinity. In any case, the resultant surface roughness of the substrate disturbs interface sharpness with a grown epitaxial layer, and thus the crystallinity and flatness of the epitaxial layer, resulting in the deterioration of the characteristics and reliability of the resultant devices.

The thermal decomposition or sublimation of a GaN crystal depends not only on a temperature, but also on the type and pressure of a gas during the thermal treatment. The method of JP 2003-59835 A is based on the concept that thermal cleaning is conducted without damaging the substrate surface, thereby starting crystal growth before surface roughening occurs on the substrate by heating. Even when thermal cleaning is conducted under the same conditions, however, this method causes surface roughening on some substrates, thereby being unsatisfactory in reproducibility.

A production lot of semiconductor substrates of GaAs, etc. are usually constituted by wafers cut out from the same bulk crystal, resulting in little unevenness in the characteristics of wafers in the lot. However, the GaN substrates are likelier to have uneven wafer characteristics than other semiconductor substrates of GaAs, etc., even in the same lot, because crystal is grown one by one as described above in the case of the GaN substrates. Accordingly, there is a problem peculiar to the GaN substrates that even when a plurality of GaN substrates (wafers) taken from the same lot are subjected to thermal cleaning under the same conditions, some substrates may suffer from surface roughness.

OBJECT OF THE INVENTION

Accordingly, an object of the present invention is to provide a III–V nitride semiconductor substrate having enough thermal stability to resist surface roughening by thermal cleaning.

Another object of the present invention is to provide a production lot of such III–V nitride semiconductor substrates.

A further object of the present invention is to provide a III–V nitride semiconductor device comprising such a III–V nitride semiconductor substrate.

A still further object of the present invention is to provide a method for producing such a III–V nitride semiconductor device.

SUMMARY OF THE INVENTION

As a result of intense research in view of the above objects, the inventor has found that (a) the surface roughening of a III–V nitride semiconductor substrate by thermal cleaning depends not only on the conditions of thermal cleaning, but also on the characteristics of a III–V nitride semiconductor substrate per se, such as the easiness of decomposition of a crystal, etc., particularly both a dislocation density on a surface of a III–V nitride semiconductor substrate, and the concentration of hydrogen atoms existing in a crystal as impurities; and that therefore, (b) when the product of the dislocation density and the concentration of hydrogen atoms usable as an index of the easiness of the thermal decomposition of the GaN crystal is reduced to a predetermined level or less, the resultant III–V nitride semiconductor substrate can be provided with excellent thermal stability to substantially completely suppress surface roughness due to thermal cleaning. The present invention has been achieved based on these findings.

Thus, the III–V nitride semiconductor substrate of the present invention comprises a III–V nitride semiconductor single crystal at least in a surface portion thereof, the product of [H] and [D] being $1 \times 10^{25}$ or less, wherein [H] represents the concentration of hydrogen atoms (the number of hydrogen atoms per $cm^3$) in a surface portion of the single crystal, and [D] represents a dislocation density (the number of dislocations per $cm^2$) on a single crystal surface.

The III–V nitride semiconductor substrate of the present invention is preferably a self-supported substrate composed of a III–V nitride semiconductor single crystal. The III–V nitride semiconductor single crystal is preferably hexagonal gallium nitride. In this case, the substrate surface is preferably a C-surface, on which a group III element appears. A surface of the substrate is preferably mirror-polished. A surface of the substrate preferably has an arithmetic average roughness Ra (JIS B 0601-1994) of 10 nm or less.

In the production lot of plural III–V nitride semiconductor substrates according to the present invention, all substrates are the above III–V nitride semiconductor substrates.

The III–V nitride semiconductor device of the present invention comprises an epitaxial layer of a III–V nitride semiconductor crystal formed on the above III–V nitride semiconductor substrate.

The method for producing a III–V nitride semiconductor device according to the present invention comprises (a) thermally treating the above III–V nitride semiconductor substrate at a temperature of 1200° C. or lower in a mixed gas of hydrogen and ammonia, and then (b) epitaxially growing a III–V nitride semiconductor crystal on the III–V nitride semiconductor substrate.

The III–V nitride semiconductor device is preferably produced by epitaxially growing a III–V nitride semiconductor crystal under the same conditions on each III–V nitride semiconductor substrate in the above production lot.

DETAILED DESCRIPTION OF THE PREFERRED EMBODIMENTS

[1] III–V Nitride Semiconductor Substrate

Figure 1:
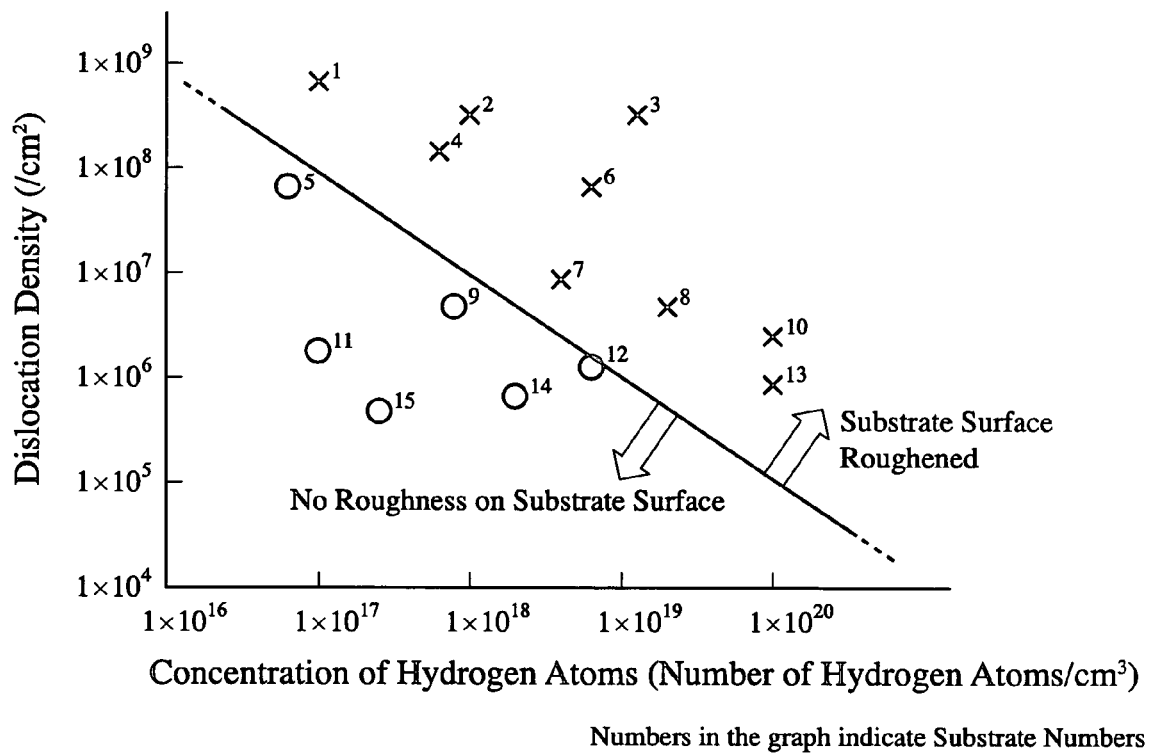
FIG. 1 is a graph showing the relation between a dislocation density on a surface of each GaN substrate produced in Example 1 and the concentration of hydrogen atoms in the crystal.

The III–V nitride semiconductor substrate of the present invention is characterized in that the product of [H] and [D] is $1 \times 10^{25}$ or less, wherein [H] represents the concentration of hydrogen atoms (the number of hydrogen atoms per $cm^3$) in a surface portion of a III–V nitride semiconductor single crystal, and [D] represents a dislocation density (the number of dislocations per $cm^2$) on the single crystal surface. Unless otherwise described, the concentration of hydrogen atoms [H] is an average value of the concentration of hydrogen atoms measured by a secondary ion mass spectrometry (SIMS) along a diameter of the substrate surface at a 5-mm interval, and the dislocation density [D] is an average number of pits counted on the substrate at arbitrary 9 points, the pits being generated by etching when the substrate is immersed in a heated mixture of phosphoric acid and sulfuric acid.

The III–V nitride semiconductors, to which the present invention is applicable, can be represented by the general formula: $In_xGa_yAl_{1-x-y}N$, wherein $0 \leq x \leq 1$, $0 \leq y \leq 1$, and $0 \leq x+y \leq 1$. Among others, semiconductors such as GaN and AlGaN are particularly preferable because they satisfy the demand of substrate materials, such as strength, production stability, etc.

The C-surface of the III–V nitride semiconductor crystal has strong polarity. Because the group III element surface is chemically and thermally stabler than the group V element surface (nitrogen surface), devices are easily produced with the group III element surface. Accordingly, the substrate surface is preferably the C-surface of the group III element.

The III–V nitride semiconductor substrate of the present invention may be a template formed by growing the III–V nitride semiconductor layer on a different substrate made of sapphire, etc., or a self-supported substrate composed only of a nitride semiconductor layer. The term "self-supported substrate" used herein means a substrate having such strength that is not only enough to maintain its shape but also suitable for handling. To have such strength, the self-supported substrate preferably has a thickness of 200 μm or more. To make the cleavage easy after the formation of devices, the self-supported substrate preferably has a thickness of 1 mm or less. When the self-supported substrate is more than 1 mm in thickness, its cleavage is difficult, resulting in a rough cleavage surface. If the self-supported substrate with a rough cleavage surface were used to produce semiconductor lasers, etc., they would have deteriorated characteristics due to reflection loss.

The III–V nitride semiconductor layer may be either a hexagonal crystal or a cubic crystal, though the hexagonal crystal is more preferable. Because a hexagonal III–V nitride semiconductor crystal is stabler than the cubic one, it is possible to form a thick epitaxial layer of a high-crystallinity III–V nitride semiconductor crystal, thereby increasing flexibility in the production of devices.

The III–V nitride semiconductor substrate of the present invention may be an untreated substrate obtained by crystal growth, a substrate ground after crystal growth, a substrate subjected to a dehydrogenation treatment after crystal growth, or a substrate ground after the dehydrogenation treatment. The dehydrogenation treatment is a treatment widely used for the activation of p-GaN, by which the substrate is kept at a temperature of about several hundreds of degrees centigrade for a predetermined period of time in an atmosphere containing no hydrogen, such as vacuum, nitrogen, etc., to remove hydrogen from the crystal.

[2] Production of III–V Nitride Semiconductor Substrate

The growth of the III–V nitride semiconductor crystal may be carried out by a know method such as an MOVPE method, an MBE method, an HVPE method. Among them, the HVPE method is advantageous in a high crystal growth rate, suitable for the production of substrates.

The type of conductivity of the substrate of the present invention may properly be selected depending on devices to be produced thereon. Examples of the conductivity type of the substrate of the present invention include an n-type doped with Si, S, O, etc., or a p-type doped with Mg, Zn, etc., or a semi-insulating type doped with a transition metal atom such as Fe, Ni, Cr, etc.

The surface of the III–V nitride semiconductor substrate of the present invention is preferably mirror-polished. The surface of the as-grown III–V nitride semiconductor epitaxial layer generally has a lot of large-scale roughness such as hillocks, etc., and a lot of small-scale roughness that is considered to be formed by step bunching. Such rough surface causes not only nonuniformity in morphology, film thickness, composition, etc. when an epitaxial layer is grown on the top surface of the substrate, but also low light exposure accuracy in a photolithography process in the production of devices. Accordingly, the substrate desirably has a flat mirror surface.

The term "dislocation" used herein includes not only dislocation generated by crystal growth, but also defects introduced by grinding, etc. after crystal growth. A damaged layer may remain on a mirror-polished substrate surface. It is thus desirable to remove a layer damaged by mirror-grinding by wet etching, dry etching, strain-removing annealing, etc., to reduce the dislocation density, thereby obtaining a substrate resistant to surface roughening.

The surface flatness of a mirror-polished substrate is preferably 10 nm or less by an arithmetic average roughness Ra, which is determined by measuring the substrate surface in a range of 50 μm×50 μm. Because the surface damage due to thermal cleaning depends on the surface roughness of the substrate, too, surface roughening by thermal cleaning may occur even at a low value of [H]×[D] when the arithmetic average roughness Ra exceeds 10 nm.

A bottom surface of the III–V nitride semiconductor substrate is also preferably ground flat like a mirror. Because the self-supported substrate of a III–V nitride semiconductor is obtained by heteroepitaxially growing a crystal on a different base substrate and then separating the base substrate, it is likely that the as-separated crystal has a rough bottom surface, to which part of the base substrate is attached. In addition, the resultant crystal layer may not be flat because of the bowed substrate. Accordingly, when growing a heteroepitaxial layer on a substrate, the substrate may have a nonuniform temperature distribution, resulting in decreased uniformity in the heteroepitaxial layer and poor reproducibility.

In the production of the III–V nitride semiconductor substrate of the present invention, for instance, the dehydrogenation treatment may be carried out, or an ELO method (JP 11-251253 A) and a VAS method (JP 2003-178984), etc. may be combined to reduce the dislocation density. The base substrate is not limited to a sapphire substrate, but may be any substrates reported for the epitaxial growth of GaN, such as GaAs, Si, $ZrB_2$, ZnO, etc.

[3] III–V Nitride Semiconductor Device and its Production Method

As described above, when the III–V nitride semiconductor substrate is mirror-polished, the substrate surface is damaged to have defects. Accordingly, when an epitaxial layer is grown directly on the mirror-polished substrate surface, the resultant epitaxial layer has poor surface conditions because of influence by defects on the substrate surface. Accordingly, the substrate surface is subjected to thermal cleaning before epitaxial growth. The thermal cleaning temperature is 1200° C. or lower. When it exceeds 1200° C., defects on the substrate surface rather increase, resulting in poor performance in devices formed thereon. The lower limit of the thermal cleaning temperature is preferably 550°

C. Sufficient cleaning of the substrate surface cannot be achieved at a thermal cleaning temperature lower than 550° C. Though different depending on the temperature, the thermal cleaning time may generally be about 5 to 30 minutes.

The thermal cleaning is preferably conducted in an atmosphere of (a) an ammonia gas, or (b) a mixed gas of ammonia and hydrogen, nitrogen, etc. A particularly preferable thermal cleaning atmosphere is a mixed gas of ammonia and hydrogen. A ratio of ammonia to hydrogen in the mixed gas of ammonia and hydrogen is preferably 1/20 to 20/1. When the ammonia/hydrogen ratio is less than 1/20, an etching reaction is likely to proceed excessively, resulting in surface roughness. On the other hand, when the ratio is more than 20/1, there is only a low effect of improving the substrate surface.

An epitaxial layer having a device structure is grown on the substrate, from which defects are removed by thermal cleaning in advance. The growth method of the epitaxial layer is not particularly restricted, but may be a known method such as an MOVPE method, an MBE method, an HVPE method, etc.

The present invention will be described in detail referring to Examples below without intention of limiting the present invention thereto.

EXAMPLE 1

15 types in total of GaN templates and self-supported GaN substrates having different dislocation densities and concentrations of hydrogen atoms were produced by an MOVPE method, an MBE method or an HVPE method under different conditions. The production conditions of each substrate are shown in Table 1. The surfaces of the self-supported GaN substrates grown by a VAS method were mirror-polished.

Each GaN template by MOVPE or MBE was produced by growing a GaN layer on a sapphire base substrate via a low-temperature-grown GaN buffer layer. There were two types of GaN substrates produced by HVPE; one was a GaN substrate produced by ELO (ELO substrate), and the other was a self-supported GaN substrate produced by VAS (VAS self-supported substrate).

The ELO substrate was produced by growing a GaN layer by an MOVPE method on a GaN template produced by an MOVPE method using trimethyl gallium (TMG) and $NH_3$ as source gases, with a striped $SiO_2$ mask disposed on the GaN template, and further growing a GaN layer by an HVPE method using GaCl and $NH_3$ as source gases.

The VAS self-supported substrate was produced by vapor-depositing a thin Ti film on a GaN template produced by an MOVPE method, subjecting the GaN template to a thermal treatment in an $H_2$ stream containing 20% of $NH_3$ to provide the thin TiN film with fine pores at a high density, and then growing a GaN layer on the GaN template by an HVPE method.

TABLE 1

| Substrate No. | Crystal-Growing Method | Thickness of GaN Layer (μm) | Temp. (°C.) | Atm.[1] | Growing Rate (μm/hour) | Dislocation-Reducing Method |
|---|---|---|---|---|---|---|
| 1 | MBE | 2 | 750 | Vacuum | 0.6 | None |
| 2 | MOVPE | 4 | 1060 | $H_2$ | 4 | None |
| 3 | MOVPE | 4 | 1050 | $H_2$ | 4 | None |
| 4 | MOVPE | 2 | 1100 | $H_2/N_2$ | 3 | None |
| 5[2] | MOVPE | 2 | 1100 | $H_2/N_2$ | 2 | None |
| 6 | MOVPE | 4 | 1050 | $H_2$ | 2 | None |
| 7 | MOVPE | 6 | 1060 | $H_2$ | 3 | Anti-surfactant |
| 8 | HVPE | 100 | 1050 | $H_2$ | 60 | ELO |
| 9 | HVPE | 120 | 1040 | $H_2/N_2$ | 60 | ELO |
| 10 | HVPE | 300 | 1055 | $H_2$ | 150 | VAS |
| 11[2] | HVPE | 330 | 1055 | $H_2/N_2$ | 120 | VAS |
| 12 | HVPE | 350 | 1050 | $H_2/N_2$ | 100 | VAS |
| 13 | HVPE | 430 | 1055 | $H_2$ | 80 | VAS |
| 14 | HVPE | 450 | 1060 | $H_2/N_2$ | 65 | VAS |
| 15[2] | HVPE | 400 | 1055 | $H_2/N_2$ | 60 | VAS |

Note:
[1] Atmosphere gas.
[2] Subjected to a thermal dehydrogenation treatment.

The concentration of hydrogen atoms [H] in the resultant crystal of the substrate was determined by a SIMS analysis. The dislocation density [D] on the substrate surface was determined by counting pits appearing after etching the GaN substrate in a heated mixture of phosphoric acid and sulfuric acid. The type and characteristics of each GaN substrate are shown in Table 2.

Each GaN substrate placed in a resistance-heating horizontal MOVPE chamber was heated at 1150° C. under normal pressure for 20 minutes in a mixed gas flow of $NH_3$ and $H_2$ ($NH_3/H_2=1/1$) for thermal cleaning. The above thermal treatment conditions correspond to particularly strict thermal cleaning conditions among those generally used, namely conditions providing a high cleaning effect but posing a high risk of generating surface roughness on the substrate.

Each thermally treated substrate was taken out of the chamber after rapid cooling, and observed with respect to its surface conditions by a Nomarski microscope to determine whether or not there was surface roughness on the substrate. With respect to the surface roughness, "No" means that the surface of the GaN substrate remained flat, and "Yes" means that the GaN substrate surface was as rough as sharkskin (if further roughened, filled with pits called thermal pits). The evaluation results of the surface roughness of each substrate are shown in Table 2. The concentration of hydrogen atoms [H] in the crystal of each substrate, and the dislocation density [D] on the substrate surface are shown in FIG. 1.

TABLE 2

| Substrate No. | Type of Substrate | Crystal-Growing Method | GaN Layer[1] |
|---|---|---|---|
| 1 | GaN Template | MBE | 2 |
| 2 | GaN Template | MOVPE | 4 |
| 3 | GaN Template | MOVPE | 4 |
| 4 | GaN Template | MOVPE | 2 |
| 5 | GaN Template | MOVPE | 2 |
| 6 | GaN Template | MOVPE | 4 |
| 7 | GaN Template | MOVPE | 6 |
| 8 | ELO Substrate | HVPE | 100 |
| 9 | ELO Substrate | HVPE | 120 |
| 10 | Self-supported VAS Substrate | HVPE | 300 |

TABLE 2-continued

| | | | |
|---|---|---|---|
| 11 | Self-supported VAS Substrate | HVPE | 330 |
| 12 | Self-supported VAS Substrate | HVPE | 350 |
| 13 | Self-supported VAS Substrate | HVPE | 430 |
| 14 | Self-supported VAS Substrate | HVPE | 450 |
| 15 | Self-supported VAS Substrate | HVPE | 400 |

| Substrate No. | [H][2] | [D][3] | [H] × [D] | Surface Roughness |
|---|---|---|---|---|
| 1 | $1 \times 10^{17}$ | $8.2 \times 10^8$ | $8.2 \times 10^{25}$ | Yes |
| 2 | $1 \times 10^{18}$ | $5.1 \times 10^8$ | $5.1 \times 10^{26}$ | Yes |
| 3 | $2 \times 10^{19}$ | $4.9 \times 10^8$ | $9.8 \times 10^{27}$ | Yes |
| 4 | $8 \times 10^{17}$ | $1.8 \times 10^8$ | $1.4 \times 10^{26}$ | Yes |
| 5 | $<8 \times 10^{16}$ | $9.1 \times 10^7$ | $<7.3 \times 10^{24}$ | No |
| 6 | $9 \times 10^{18}$ | $9.0 \times 10^7$ | $8.1 \times 10^{26}$ | Yes |
| 7 | $4 \times 10^{18}$ | $1.0 \times 10^7$ | $4.0 \times 10^{25}$ | Yes |
| 8 | $2 \times 10^{19}$ | $6.5 \times 10^6$ | $1.3 \times 10^{26}$ | Yes |
| 9 | $9 \times 10^{17}$ | $6.2 \times 10^6$ | $5.6 \times 10^{24}$ | No |
| 10 | $1 \times 10^{20}$ | $4.3 \times 10^6$ | $4.3 \times 10^{26}$ | Yes |
| 11 | $1 \times 10^{17}$ | $2.2 \times 10^6$ | $2.2 \times 10^{23}$ | No |
| 12 | $8 \times 10^{18}$ | $1.2 \times 10^6$ | $9.6 \times 10^{24}$ | No |
| 13 | $1 \times 10^{20}$ | $1.0 \times 10^6$ | $1.0 \times 10^{26}$ | Yes |
| 14 | $2 \times 10^{18}$ | $9.4 \times 10^5$ | $1.9 \times 10^{24}$ | No |
| 15 | $3 \times 10^{17}$ | $8.2 \times 10^5$ | $2.5 \times 10^{23}$ | No |

Note:
[1]Thickness (μm).
[2]The concentration of hydrogen atoms (the number of hydrogen atoms per cm$^3$).
[3]Dislocation density (the number of dislocations per cm$^2$).

As is clear from Table 2 and FIG. 1, though there is a tendency that the lower the concentration of hydrogen atoms in the GaN substrate, the less surface roughness appears, surface roughness would be generated even at a low concentration of hydrogen atoms if there were a high dislocation density. Likewise, though there is a tendency that the lower the dislocation density of the GaN substrate, the less surface roughness appears, surface roughness would be generated even with a low dislocation density if there were a high concentration of hydrogen atoms. Namely, to prevent the surface roughness from generating on the GaN substrate by thermal cleaning, the GaN substrate should have a low concentration of hydrogen atoms and a low dislocation density. As a result of the above consideration, it has been found that the boundary condition of generating no surface roughness on the GaN substrate by thermal cleaning is that the product of the concentration of hydrogen atoms and the dislocation density ([H]×[D]) is $1 \times 10^{25}$ or less. It has also been found that the growing method and thickness of a GaN layer have no direct relations to whether or not the substrate is easily roughened.

EXAMPLE 2

A surface of a 2-inch-diameter single-crystal sapphire base substrate, whose plane direction was C-plane offset by 0.2° toward an m-axis, was thermally cleaned at 1200° C. for 10 minutes in a hydrogen gas atmosphere. With the base substrate temperature lowered to 600° C., a 20-nm-thick, low-temperature GaN buffer layer was grown on the sapphire base substrate at an atmospheric pressure by an MOVPE method using trimethyl gallium (TMG) and NH$_3$ as source gases. With the base substrate temperature elevated to 1050° C., the low-temperature GaN buffer layer was then microcrystallized by a thermal treatment at 1050° C. for 5 minutes. This thermal treatment can reduce the density of initial nuclei of a subsequently grown GaN crystal, resulting in a relatively decreased dislocation density. A GaN epitaxial layer was grown to a thickness of 4 μm, by continuously supplying the source gases onto the resultant substrate. During the above process, the crystal growth rate was about 4 μm/hour, using a mixed gas of hydrogen and nitrogen as a carrier gas. At a time when the grown GaN layer was cooled to 800° C. in a chamber, the atmosphere gas was changed to a nitrogen gas only, to obtain the same effect as a dehydrogenation treatment, and the GaN layer was slowly cooled to 100° C. or lower over about 3 hours in an atmosphere containing no hydrogen gas. Thus obtained was a GaN template with a relatively low dislocation and a low hydrogen concentration. The measurement of surface roughness in a range of 50 μm×50 μm revealed that this GaN template had an arithmetic average roughness Ra of 2 nm or less at any points.

The dislocation density on a surface of this GaN template was measured by immersing the substrate in a heated mixture of phosphoric acid and sulfuric acid, and counting the number of pits generated by etching. As a result, the in-plane dislocation density of this GaN template was $(1\pm1)\times10^8$/cm$^2$. The concentration of hydrogen atoms in a surface portion of the GaN template measured by SIMS at a 5-mm interval along a diameter of the substrate was less than $8\times10^{16}$/cm$^3$, as the number of hydrogen atoms per cm$^3$. Because $8\times10^{16}$ hydrogen atoms per cm$^3$ is the lower detection limit of SIMS, it is clear that the concentration of hydrogen atoms in a surface portion of this GaN template was lower than the detection limit of SIMS. From the above results, [H]×[D] was less than about $8\times10^{24}$ in the GaN template in this Example.

COMPARATIVE EXAMPLE 1

A surface of a 2-inch-diameter single-crystal sapphire base substrate, whose plane direction was C-plane offset by 0.2° toward an m-axis, was thermally cleaned at 1200° C. for 10 minutes in a hydrogen gas atmosphere. With the base substrate temperature lowered to 600° C., a low-temperature GaN buffer layer was grown to a thickness of 20 nm on the sapphire base substrate at an atmospheric pressure by an MOVPE method using TMG and NH$_3$ as source gases. With the base substrate temperature elevated to 1050° C., a GaN layer was grown to a thickness of 2 μm without conducting the thermal treatment of the low-temperature buffer layer. During the growing process, the crystal growth rate was about 4 μm/hour, using a mixed gas of hydrogen and nitrogen as a carrier gas. The grown GaN layer was cooled to 100° C. in a mixed gas of ammonia, hydrogen and nitrogen like the growth atmosphere, to obtain a GaN template. The measurement in a range of 50 μm×50 μm revealed that this GaN template had an arithmetic average surface roughness Ra not larger than that in Example 2.

The GaN template was measured with respect to a dislocation density on a surface and the concentration of hydrogen atoms in a surface portion in the same manner as in Example 2. As a result, the in-plane dislocation density of the GaN template was $(2\pm1)\times10^9$/cm$^2$, and the concentration of hydrogen atoms was $1\times10^{17}$/cm$^3$. From the above results, [H]×[D] was about $2\times10^{26}$ in the GaN template of Comparative Example 1.

Evaluation

Each GaN template in Example 2 and Comparative Example 1 was cut to half, and a semicircular GaN template in Example 2 was combined with a semicircular GaN template in Comparative Example 1 on a substrate susceptor, and placed in an MOVPE reaction chamber. These GaN templates were heated to 1100° C. for 20 minutes in a mixed gas flow of $NH_3$ and $H_2$ ($NH_3/H_2=1/2$), to thermally clean their surfaces. A GaN layer was homoepitaxially grown to a thickness of 2 μm on the substrate by supplying TMG and $NH_3$. During the process, a mixed gas of hydrogen and nitrogen was used as a carrier gas at an atmospheric pressure.

Figure 2:
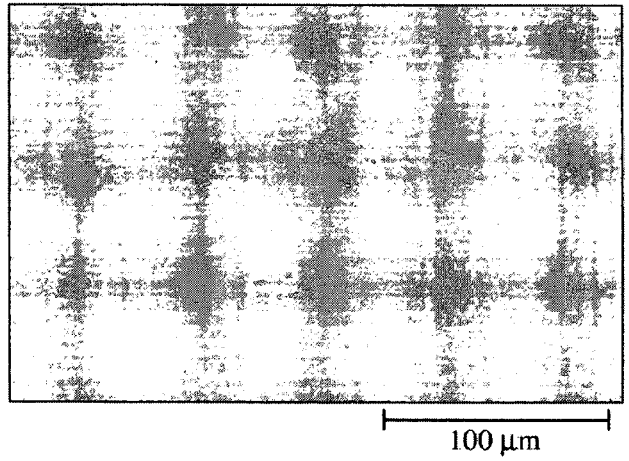
FIG. 2 is a photomicrograph showing the surface condition of a GaN layer formed after thermally cleaning the GaN template in Example 2.
Figure 3:
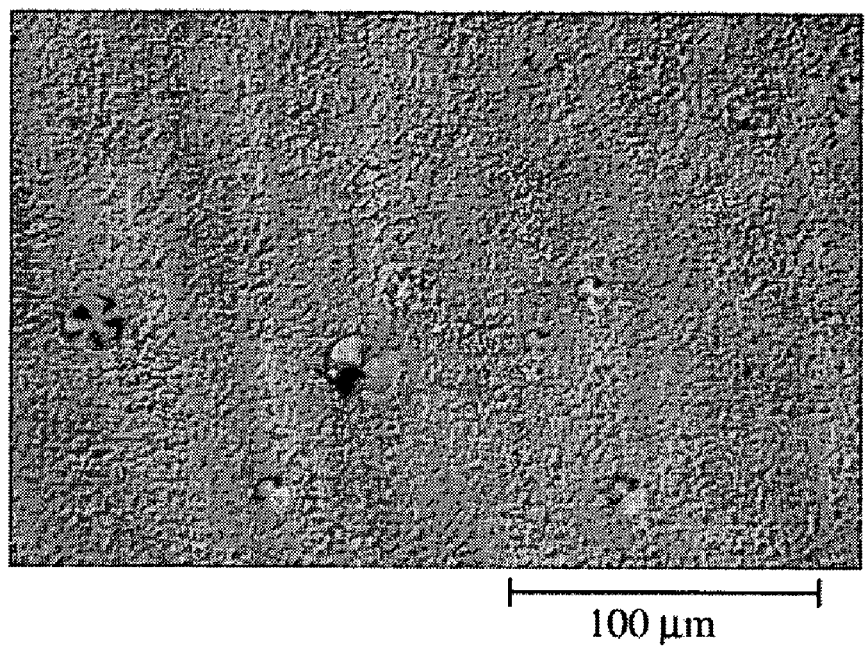
FIG. 3 is a photomicrograph showing the surface condition of a GaN layer formed after thermally cleaning the GaN template in Comparative Example 1.

Each GaN template having homoepitaxially grown GaN was taken out, and its surface was observed by the naked eye using a projector. It was thus found that a GaN layer grown on the GaN template of Example 2 had a non-cloudy mirror surface, while a GaN layer grown on the GaN template of Comparative Example 1 had a slightly cloudy surface. The observation of each GaN layer surface by a Nomarski microscope revealed that there was no morphology on the GaN layer surface of Example 2 as shown in FIG. 2. On the other hand, there was a lot of roughness like thermal pits on the GaN layer surface of Comparative Example 1 as shown in FIG. 3. Such roughness seems to be morphology generated by epitaxial growth on the GaN template surface of Comparative Example 1, which was roughened before the homoepitaxial growth of GaN.

EXAMPLE 3

An undoped GaN layer was grown to a thickness of 300 nm on a C-plane of a 2-inch-diameter single-crystal sapphire base substrate using a low-temperature buffer technology by an MOVPE method using TMG and $NH_3$ as source gases. A thin Ti film was vapor-deposited to a thickness of 20 nm on this undoped GaN layer. The resultant substrate was placed in an electric furnace, and thermally treated at 1050° C. for 20 minutes in an $H_2$ stream containing 20% of $NH_3$. As a result, part of the GaN layer was etched, resulting in voids at a high density (void layer), and the Ti layer was nitrided to have fine pores on the order of submicrons at a high density.

This substrate was placed in an HVPE chamber to grow a GaN layer to a thickness of 600 μm while supplying a gas containing source gases of GaCl at $8\times10^{-3}$ atm and $NH_3$ at $4.8\times10^{-2}$ atm in a carrier gas. The carrier gas was an $N_2$ gas containing 5% of $H_2$ in the first half of growth, and changed to an $N_2$ gas only at a stage that the thickness of the resultant GaN layer became about 400 μm, to achieve a low concentration of hydrogen atoms on the surface of the GaN layer. The growth conditions of the GaN layer were atmospheric pressure and a substrate temperature of 1080° C. At the growth step of the GaN crystal, $SiH_2Cl_2$ was supplied to the substrate as a doping gas, so that the GaN crystal was doped with Si. After the completion of growth, the GaN layer was spontaneously separated from the base substrate with a void layer as a boundary during the process of cooling the HVPE apparatus, to obtain a self-supported GaN substrate.

Top and bottom surface portions of the resultant self-supported substrate were removed by grinding, such that both surfaces were mirror-finished. The thickness of a top surface portion removed was 100 μm, and the thickness of a bottom surface portion removed was 70 μm, so that the final thickness of the GaN layer was 430 μm. Under the same conditions, 10 self-supported GaN substrates were produced.

One of the resultant self-supported GaN substrates was measured with respect to the concentration of hydrogen atoms in a surface portion of the substrate by SIMS at a 5-mm interval along a diameter of the substrate. It was thus found that the concentration of hydrogen atoms in the GaN crystal was below the lower detection limit ($8\times10^{16}$ hydrogen atoms per $cm^3$) of SIMS at any points. The dislocation density on the surface of the self-supported GaN substrate was determined by immersing the substrate in a heated mixture of phosphoric acid and sulfuric acid, and counting pits generated by etching. It was thus found that the in-plane dislocation density of the self-supported GaN substrate was $(4.2\pm1)\times10^6/cm^2$. From the above results, [H]×[D] of the self-supported GaN substrate was about $3.4\times10^{23}$ or less.

With six substrates selected out of the above self-supported GaN substrates, all of them were subjected to simultaneous growth of epitaxial layers each having an LED structure grown in an MOVPE apparatus capable of conducting simultaneous growth. The source gases used were TMG, TMA (trimethyl aluminum), TMI (trimethyl indium) and $NH_3$. First, the self-supported GaN substrate was heated to 1150° C. in a mixed gas flow of $NH_3$ and $H_2$ ($NH_3/H_2=1/2$), and kept at that temperature for 5 minutes. The source gases were supplied successively in an order from a group III source gas necessary for growing a first layer, to grow each epitaxial layer. A grown epitaxial wafer had a structure comprising a 1-μm-thick n-GaN layer, an $In_{0.15}Ga_{0.85}N/GaN$-3-MQW active layer (comprising a 3-nm-thick well layer and a 10-nm-thick barrier layer), a 40-nm-thick p-$Al_{0.1}Ga_{0.9}N$ layer, and a 500-nm-thick p-GaN layer in this order from the substrate side. The MQW layer was grown at a temperature lowered to 800° C. The other layers were grown at a temperature of 1150° C. The growth pressure was an atmospheric pressure for every layer.

The observation of surface conditions of all grown epitaxial layers by a Nomarski microscope revealed that any grown epitaxial layer had a mirror surface free from roughness due to thermal cleaning.

Though the present invention has been explained above in detail referring to Examples for the purpose of exemplification, it should be noted that various modifications may be included within the scope of the present invention. For instance, dehydrogenation may be separately carried out, and a known ELO method using $SiO_2$ masks, etc. may be included in the method of the present invention to reduce the dislocation density. Though Examples used a sapphire base substrate, a substrate of GaAs, Si, $ZrB_2$, ZnO, etc. may be used.

Because the product of a dislocation density and the concentration of hydrogen atoms, which is an index of the easiness of the thermal decomposition of the substrate, is at a predetermined level or less, the III–V nitride semiconductor substrate of the present invention has such excellent thermal stability that its surface damage due to thermal cleaning can be suppressed. Accordingly, the III–V nitride semiconductor substrate of the present invention is suitable for the III–V nitride semiconductor devices such as laser diodes (LDs), light-emitting diodes (LEDs), etc.

In addition, because thermal cleaning can be conducted sufficiently while suppressing the substrate surface from being roughened, it is possible to grow an epitaxial layer having a device structure on a smooth substrate surface. Accordingly, a uniform epitaxial layer can be formed on a wafer surface with little unevenness between wafers, making it possible to stably produce light-emitting devices and electronic devices at a good yield.

What is claimed is:

1. A III–V nitride semiconductor substrate comprising a III–V nitride semiconductor single crystal at least in a surface portion thereof, the product of [H] and [D] being $1\times10^{25}$ or less, wherein [H] represents the concentration of hydrogen atoms (the number of hydrogen atoms per cm$^3$) in a surface portion of said single crystal, and [D] represents a dislocation density (the number of dislocations per cm$^2$) on a single crystal surface.

2. The III–V nitride semiconductor substrate according to claim 1, wherein it is a self-supported substrate composed of a III–V nitride semiconductor single crystal.

3. The III–V nitride semiconductor substrate according to claim 1, wherein said III–V nitride semiconductor single crystal is hexagonal gallium nitride.

4. The III–V nitride semiconductor substrate according to claim 3, whose substrate surface is a C-plane, on which a group III element appears.

5. The III–V nitride semiconductor substrate according to claim 1, wherein a surface of said substrate is mirror-polished.

6. The III–V nitride semiconductor substrate according to claim 1, wherein a surface of said substrate has an arithmetic average roughness Ra of 10 nm or less.

7. A production lot of plural III–V nitride semiconductor substrates, wherein all substrates in said production lot are III–V nitride semiconductor substrates each comprising a III–V nitride semiconductor single crystal at least in a surface portion thereof, the product of [H] and [D] being $1 \times 10^{25}$ or less, wherein [H] represents the concentration of hydrogen atoms (the number of hydrogen atoms per cm$^3$) in a surface portion of said single crystal, and [D] represents a dislocation density (the number of dislocations per cm$^2$) on a single crystal surface.

8. A III–V nitride semiconductor device comprising an epitaxial layer of a III–V nitride semiconductor crystal formed on a III–V nitride semiconductor substrate comprising a III–V nitride semiconductor single crystal at least in a surface portion thereof, the product of [H] and [D] being $1 \times 10^{25}$ or less, wherein [H] represents the concentration of hydrogen atoms (the number of hydrogen atoms per cm$^3$) in a surface portion of said single crystal, and [D] represents a dislocation density (the number of dislocations per cm$^2$) on a single crystal surface.

* * * * *